United States Patent
Moosa et al.

(10) Patent No.: US 7,215,268 B1
(45) Date of Patent: May 8, 2007

(54) SIGNAL CONVERTERS WITH MULTIPLE GATE DEVICES

(75) Inventors: Mohamed S. Moosa, Round Rock, TX (US); Sriram S. Kalpat, Austin, TX (US); Leo Mathew, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/250,993

(22) Filed: Oct. 14, 2005

(51) Int. Cl.
*H03M 1/00* (2006.01)

(52) U.S. Cl. ........................................ 341/136; 341/155

(58) Field of Classification Search ................ 341/144, 341/155, 172, 134, 136; 327/77, 75
See application file for complete search history.

(56) References Cited

U.S. PATENT DOCUMENTS

| | | | |
|---|---|---|---|
| 4,872,010 A * | 10/1989 | Larson et al. ................ | 341/134 |
| 5,144,170 A | 9/1992 | Parker | |
| 5,463,353 A | 10/1995 | Countryman et al. | |
| 5,675,341 A * | 10/1997 | Vallancourt et al. ........ | 341/158 |
| 5,936,433 A * | 8/1999 | Holloway ..................... | 327/75 |
| 6,222,395 B1 * | 4/2001 | Bertin et al. .................. | 327/77 |
| 6,462,527 B1 * | 10/2002 | Maneatis ..................... | 323/315 |
| 6,677,569 B2 * | 1/2004 | Beusch ..................... | 250/208.1 |
| 6,720,812 B2 * | 4/2004 | Tumer et al. ................ | 327/170 |
| 6,842,136 B1 * | 1/2005 | Agarwal et al. ............ | 341/155 |
| 6,972,702 B1 * | 12/2005 | Moon .......................... | 341/133 |

OTHER PUBLICATIONS

Mathew et al, "Multiple Independent Gate Field Effect Transistor (MIGFET)—Multi-Fin RF Mixer Architecture, Three Independent Gates (MIGFET-T) Operation and Temperature Characteristics"; 2005 Symposium on VLSI Technology Digest of Technical Papers, pp. 200-201, no month.

Mathew et al; "CMOS Vertical multiple Independent Gate Field Effect Transistor (MIGFET)"; SOI Conference 2004; 4 pp, no month.

Leme et al.; "High Performance CMOS Comparator for Analogue-Digital Convertors"; Electronics Letters; Sep. 20, 1990; 2 pp; vol. 26, Issue 20; IEEE.

Mathew et al; Abstract: "Multiple Independent Gate Field Effect Transistor (MIGFET)—Device, Process, Applications"; 207th ECS Conference; May 15-20, 2005, Quebec City, Canada, 1 pg.

Mathew et al; "Multiple Independent Gate Field Effect Transistor (MIGFET)—Device, Process, Applications"; 207th ECS Conference; May 15-20, 2005, Quebec City, Canada, 10 pgs.

* cited by examiner

*Primary Examiner*—Peguy JeanPierre
(74) *Attorney, Agent, or Firm*—Ranjeev Singh; James L. Clingan, Jr.

(57) ABSTRACT

An analog to digital converter including a plurality of multiple independent gate field effect transistors (MIGFET) that provide a plurality of digital output signals, is provided. Each MIGFET of the plurality of MIGFETs may have first gate for receiving an analog signal, a second gate for being biased, and a current electrode for providing a digital output signal from among the plurality of the digital output signals. Each MIGFET of the plurality of MIGFETs may have a combination of body width, channel length that is unique among the plurality of MIGFETs to result in a threshold voltage that is unique among the plurality of MIGFETs. A digital to analog converter including a plurality of MIGFETs is also provided.

18 Claims, 2 Drawing Sheets

SIGNAL CONVERTERS WITH MULTIPLE GATE DEVICES

RELATED APPLICATIONS

A related, copending application is entitled "Method and Circuit for Multiplying Signals With a Transistor Having More Than One Independent Gate Structure," by Yang Du et al., application Ser. No. 10/728,621, assigned to Freescale Semiconductor, Inc., and was filed on Dec. 5, 2003.

A related, copending application is entitled "Fully Programmable Phase Locked Loop," by Hector Sanchez et al., application Ser. No. 11/069,664, assigned to Freescale Semiconductor, Inc., and was filed on Mar. 1, 2005.

A related application is entitled "Voltage Controlled Oscillator with a Multiple Gate Transistor and Method Therefor," by Sriram Kalpat et al., application Ser. No. 11/250,994 assigned to Freescale Semiconductor, Inc. and filed simultaneously herewith.

A related application is entitled "Voltage Controlled Oscillator Having Digitally Controlled Phase Adjustment and Method Therefor," by Hector Sanchez et al., application Ser. No. 11/251,467, assigned to Freescale Semiconductor, Inc. and filed simultaneously herewith.

A related application Ser. No. 11/251,470 is entitled "Output Driver Circuit with Multiple Gate Devices" by Hector Sanchez, assigned to Freescale Semiconductor, Inc., which was filed on Oct. 14, 2005.

FIELD OF THE INVENTION

The present invention relates generally to signal converters, and more particularly to signal converters with multiple gate devices.

RELATED ART

Traditionally, signal converters, such as analog to digital converters (ADCs) and digital to analog converters (DACs) have used resistor banks and comparators to convert an analog signal to a digital signal and vice versa. The use of resistor banks and comparators in such signal converters presents several problems. For example, process variations or thermal effects may result in resistor banks that provide inaccurate voltage division. This is because it is difficult to fabricate high precision resistors in an integrated circuit. Thus, use of traditional resistor banks in signal converters may result in errors in signal conversion.

Furthermore, use of comparators raises the implementation complexity of signal converter circuits. In particular, each comparator may be implemented using approximately 15 transistors. A typical 32 level signal converter, such as an ADC, may then need approximately 480 transistors. Thus, there is a need for signal converters that result in lower errors during signal conversion and are less complex.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE EMBODIMENTS

A signal converter, whether analog to digital or digital to analog, may use multiple independent gate FETs (MIGFETs) with different threshold voltages to provide the conversion. The MIGFETs may have different threshold voltages based preferably on body width and channel length to provide the number of different conversions required. This takes advantage of the relatively linear change in threshold voltage with body width change. Thus many different threshold voltages may be available by altering the body width by the corresponding amounts. This is similarly true for channel length change for MIGFETs. The combination of body width and channel length may make for a large number of different threshold voltages. Threshold voltage may further be adjustable with the second independent gate of the MIGFETs. This may be useful for establishing an offset for the threshold voltages to be calibrated relative to an independently determined reference voltage.

In one aspect, an analog to digital converter comprising a plurality of multiple independent gate field effect transistors (MIGFET) that provide a plurality of digital output signals, is provided. Each MIGFET of the plurality of MIGFETs may have a first gate for receiving an analog signal, a second gate for being biased, and a current electrode for providing a digital output signal from among the plurality of the digital output signals. Each MIGFET of the plurality of MIGFETs may have a combination of body width and channel length that is unique among the plurality of MIGFETs to result in a threshold voltage that is unique among the plurality of MIGFETs. Each MIGFET may have a second current electrode coupled to a ground terminal.

In another aspect, an analog to digital converter comprising a plurality of FETs that provides a plurality of digital output signals, is provided. Each FET of the plurality FETs may have a first gate for receiving an analog signal and a current electrode for providing a digital output signal of a plurality of the digital output signals. Each FET of the plurality of FETs may have a threshold voltage that is unique among the plurality of FETs.

In yet another aspect, a digital to analog converter comprising a plurality of FETs that provides an analog signal at a summing node is provided. Each FET of the plurality of FETs may have a first gate for receiving a different digital signal from among a plurality of digital signals, and a current electrode coupled to the summing node. Each FET of the plurality of FETs may have a threshold voltage that is unique among the plurality of FETs.

Figure 1:
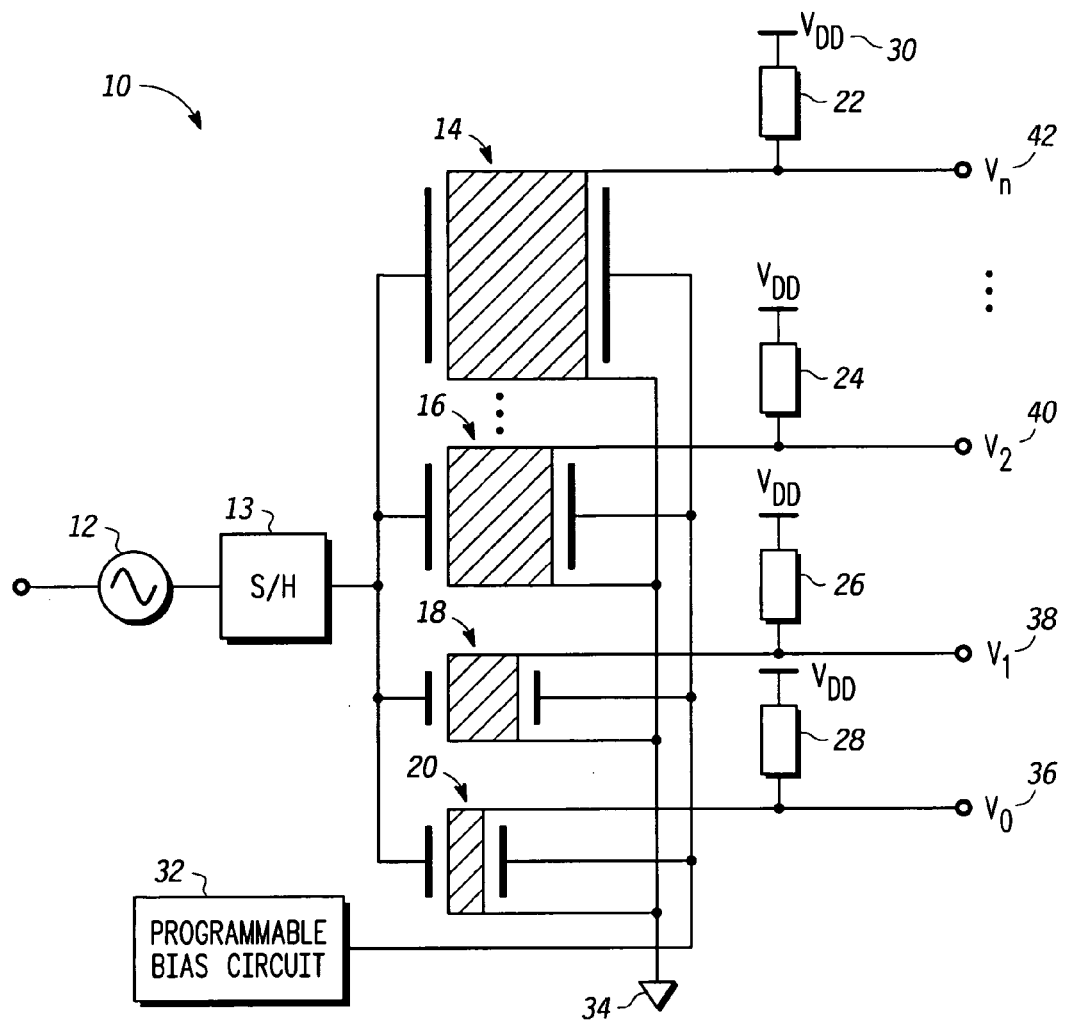
FIG. 1 is an exemplary analog to digital converter having multiple gate devices, consistent with one embodiment of the invention.

FIG. 1 is an exemplary analog to digital converter 10 having multiple gate devices, consistent with one embodiment of the invention. Analog to digital converter (ADC) 10 may be implemented using multiple gate devices 14, 16, 18, and 20, for example. ADC 10 may receive an analog signal 12, which may then be sampled using a sample and hold circuit 13. The sampled analog signal may then be fed to a first gate of each of multiple gate devices 14, 16, 18, and 20. For an N-channel implementation, a current electrode, the drain terminal, of each of the multiple gate devices 14, 16, 18, and 20 may be connected via respective load elements 22, 24, 26, and 28 to a voltage source ($V_{dd}$) 30. For an N-channel implementation, a second current electrode, the source terminal, of each of the multiple gate devices 14, 16, 18, and 20 may be grounded. Alternatively, in a P-channel implementation, the source terminal of each of the multiple gate devices 14, 16, 18, and 20 may be connected to $V_{dd}$. A second gate of each of multiple gate devices 14, 16, 18, and 20 may be connected to a programmable bias circuit 32. Programmable bias circuit 32 may provide a selectable bias voltage or a set of selectable bias voltages to the multiple gate devices 14, 16, 18, and 20. Thus, each multiple gate device may have the same or a different bias voltage applied to its second gate. Each multiple gate device may provide an output, which in combination with the outputs $V_0$ 36, $V_1$ 38, $V_2$ 40 . . . and $V_n$ 42 may represent a digital value corresponding to an analog input value. Thus, for example, if sixteen multiple gate devices are used in FIG. 1, then the output may be 16 digital signals corresponding to a particular sampled analog value.

Digital signals need not be linear in relation to the analog input value. By way of example, digital signals may be a logarithmic function, a non-linear function, or any other user-desirable function of the analog input value. Although not shown in FIG. 1, the 16 digital signals may be further processed to generate a digital word corresponding to a particular sampled analog signal value. Depending upon the granularity of the quantization value needed, any appropriate number of multiple gate devices may be used. In operation, the sampled analog signal is used to bias each of the multiple gate devices 14, 16, 18, and 20.

Multiple gate devices 14, 16, 18, and 20 may be implemented using a multiple independent gate field effect transistor (MIGFET), FinFET, or any other suitable multiple gate transistor. Load elements 22, 24, 26, and 28 may be implemented using a resistor, MIGFET, FinFET, or any other suitable transistor. Each of these transistors may be N-channel or P-channel. Further, each of these transistors may be planar or non-planar. In addition, the transistors corresponding to the load elements may have tunable impedances.

The threshold voltage of these multiple gate devices determines which one of these will be turned on when a certain value of the sampled analog signal is applied. In general, when a particular multiple gate device is turned on, the output current increases for that particular multiple gate device. This would result in a first voltage output value corresponding to that multiple gate device, as the increased output current flows through the load element (22, for example). In contrast, when a particular multiple gate device is turned off, the output current decreases substantially for that particular multiple gate device. This would result in a second voltage output value corresponding to that multiple gate device, as the decreased output current flows through the load element (22, for example). A particular multiple gate device may be turned on when the input sampled analog signal value exceeds the threshold voltage of the particular multiple gate device. As shown in FIG. 1, each of these multiple gate devices 14, 16, 18, and 20 may have a different threshold voltage. The threshold voltage of each of these multiple gate devices may depend, among other things, on the channel length, the body width, and the gate bias of the second gate of the multiple gate device. Although FIG. 1 shows multiple gate devices 14, 16, 18, and 20 as having two gates, they may have additional gates.

Figure 2:
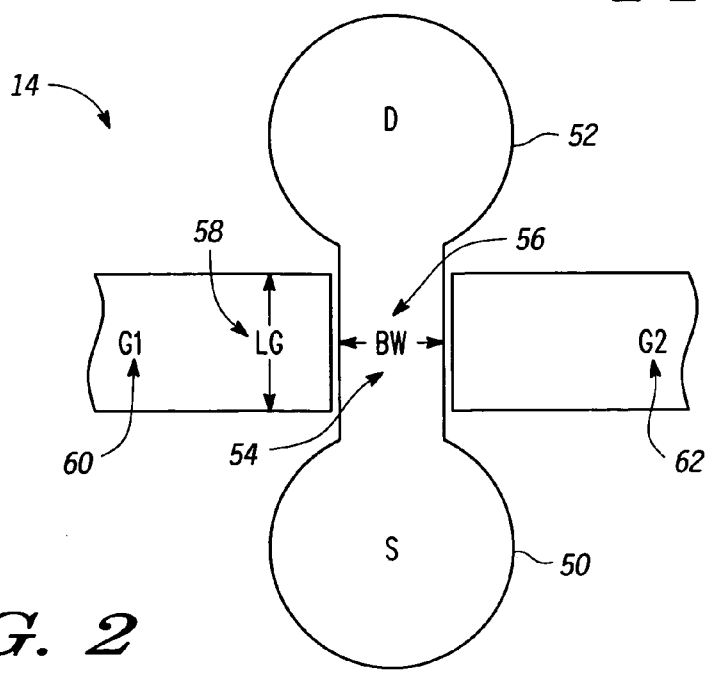
FIG. 2 is a partial top view of an exemplary multiple gate device that may be used as part of the exemplary analog to digital converter of FIG. 1.

FIG. 2 is a partial top view of an exemplary multiple gate device 14 that may be used as part of the exemplary analog to digital converter of FIG. 1. Multiple gate device 14 may include a source 50, a drain 52, and a channel 54. Additionally, multiple gate device 14 may include two gates: gate G1 60 and gate G2 62. By using suitable semiconductor processing and design techniques, body width (BW) 56 and channel length (LG) 58 may be varied for each of the multiple gate devices 14, 16, 18, and 20. The body width and the channel length may be defined during the layout of the active area and gate area, respectively. Various combinations of the body width and the channel length may result in different voltage thresholds for a particular multiple gate device.

Figure 3:
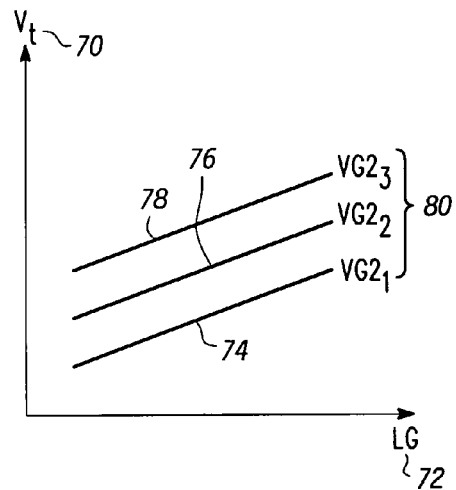
FIG. 3 is a graph illustrating exemplary relationship between the threshold voltage of a multiple gate device and its channel length, consistent with one embodiment of the invention.

FIG. 3 is a graph illustrating exemplary relationship between the threshold voltage of a multiple gate device and its channel length, consistent with one embodiment of the invention. By way of example, as shown in FIG. 3, threshold voltage ($V_t$) 70 may change as channel length (LG) 72 is changed. Exemplary lines (74, 76, and 78) represent the relationship between threshold voltage ($V_t$) 70 and channel length (LG) 72, as bias voltage for the second gate (VG2) of a multiple gate device is varied ($VG2_1$, $VG2_2$, and $VG2_3$ 80). Thus, the threshold voltage ($V_t$) 70 of a multiple gate device may be varied based on its channel length. By way of example, channel length of a multiple gate device (14, for example) may be varied from 30 nano-meters to 100 nano-meters. Referring back to FIG. 1, in one embodiment of analog to digital converter 10, multiple gate device 14 may have a first body width and a first channel length. Multiple gate device 16 may have a second body width and a second channel length. Multiple gate device 18 may have a third body width and a third channel length. Multiple gate device 20 may have a fourth body width and a fourth channel length.

Figure 4:
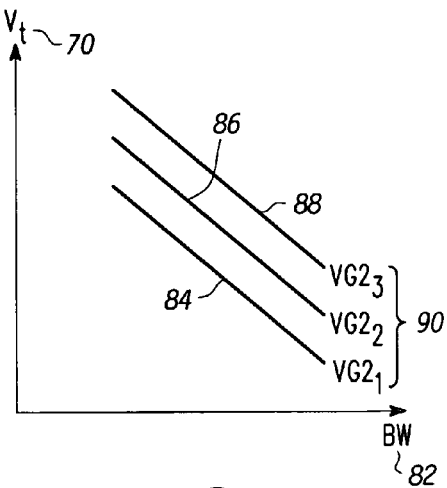
FIG. 4 is a graph illustrating exemplary relationship between the threshold voltage of a multiple gate device and its body width, consistent with one embodiment of the invention.

FIG. 4 is a graph illustrating exemplary relationship between the threshold voltage of a multiple gate device and its body width, consistent with one embodiment of the invention. By way of example, as shown in FIG. 4, threshold voltage ($V_t$) 70 may change as body width (BW) 82 is changed. Exemplary lines (84, 86, and 88) represent the relationship between threshold voltage ($V_t$) 70 and body width (BW) 82, as bias voltage for the second gate (VG2) of a multiple gate device is varied ($VG2_1$, $VG2_2$, and $VG2_3$ 90). Thus, the threshold voltage ($V_t$) 70 of a multiple gate device may be varied based on its body width. By way of example, body width of a multiple gate device (14, for example) may be varied from 10 nano-meters to 100 nano-meters. By using appropriately calibrated simulation software, such as MAT-LAB, various combinations of channel length, body width, and bias voltage may be tested to select the right combination of these values for each of the multiple gate devices 14, 16, 18, and 20. Indeed, any other suitable tool may also be used for this purpose.

Figure 5:
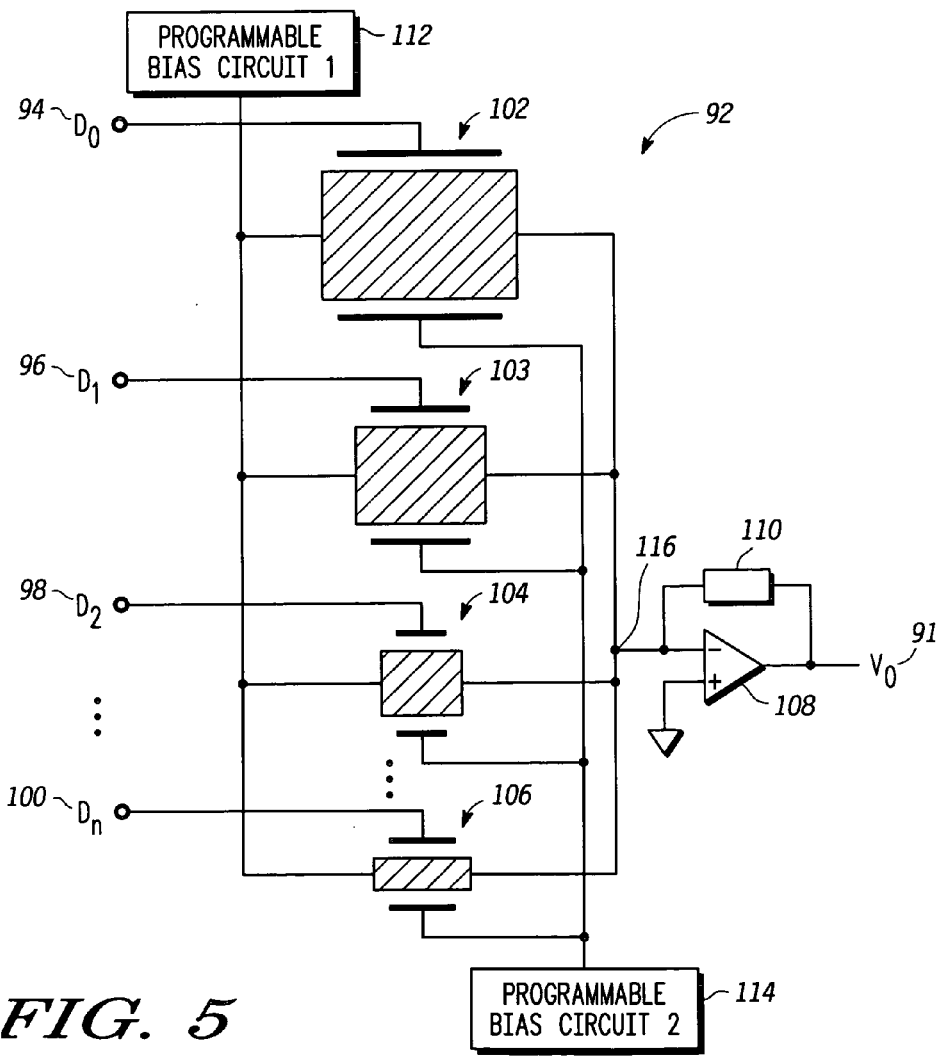
FIG. 5 is an exemplary digital to analog converter having multiple gate devices, consistent with another embodiment of the invention.

FIG. 5 is an exemplary digital to analog converter having multiple gate devices, consistent with another embodiment of the invention. Digital to analog converter (DAC) 92 may be implemented using multiple gate devices 102, 103, 104, and 106. DAC 92 may receive digital signals $D_0$ 94, $D_1$ 96, $D_2$ 98, and $D_1$ 100 and may convert these digital signals into an analog voltage $V_O$ 91. Each of received digital signals $D_0$ 94, $D_1$ 96, $D_2$ 98, and $D_n$ 100 may make the respective multiple gate device conductive. An electrode, for example the source, of each of the multiple gate devices 102, 103, 104, and 106 may be coupled to a programmable bias circuit 1 112. Each conductive multiple gate device may generate a current at a summing node 116, which may then be coupled to a first input of a current to voltage converter, which may include an operational amplifier 108 and a feedback element 110. Indeed, any suitable components may be used to implement the current to voltage converter. Although FIG. 5 shows multiple gate devices 102, 103, 104, and 106 as having two gates, they may have additional gates. By way of example, each of multiple gate devices 102, 103, 104, and 106 may be implemented using a resistor, a multiple independent gate field effect transistor (MIGFET), FinFET, or any other suitable multiple gate transistor. As explained above, with reference to FIGS. 2, 3, and 4, channel length, body width, and bias voltage for the second gate of the multiple gate devices may be varied.

Referring again to FIG. 5, a programmable bias circuit 2 114 may provide a programmable bias voltage to the second gate of each of the multiple gate devices. The programmable bias voltage may be different or the same for each of the multiple gate devices. As further explained above with reference to FIGS. 3 and 4, the threshold voltage for a particular multiple gate device varies with its channel length, body width, and bias voltage. The on-current changes in accordance with the change in the threshold voltage. Thus, a change in the channel length, the body width, and/or the bias voltage of a multiple gate device, changes the current the multiple gate device would supply to the current to voltage converter. By selecting appropriate values of the channel length, the body width, and/or the bias voltage of the multiple gate devices, the current supplied to the current to voltage converter can be set, such that it generates an analog voltage representing a particular digital word. By using appropriately calibrated simulation software, such as MATLAB, various combinations of channel length, body width, and bias voltage may be tested to select the right combination of these values for each of the multiple gate devices 102, 103, 104, and 106. Indeed, any other suitable tool may also be used for this purpose. The output analog voltage need not be linear in relation to the input digital signals. By way of example, the output analog voltage may be a logarithmic function, a non-linear function, or any other user-desirable function of the input digital signals.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An analog to digital converter comprising:
    a plurality of multiple independent gate FETs (MIGFETs) that provides a plurality of digital output signals, wherein
    each MIGFET of the plurality of MIGFETs has a first gate for receiving an analog signal, a second gate for being biased, and a current electrode for providing a digital output signal from among the plurality of the digital output signals; and
    each MIGFET of the plurality of MIGFETs has a combination of body width and channel length that is unique among the plurality of MIGFETs to result in a threshold voltage that is unique among the plurality of MIGFETs.

2. The analog to digital converter of claim 1, wherein the plurality of MIGFETs comprises:
    a first MIGFET having a first body width and a first channel length;
    a second MIGFET having a second body width and a second channel length;
    a third MIGFET having a third body width and a third channel length; and
    a fourth MIGFET having a fourth body width and a fourth channel length.

3. The analog to digital converter of claim 1, wherein each of the MIGFETS of the plurality of MIGFETs is further characterized as having a second current electrode coupled to a ground terminal.

4. The analog to digital converter of claim 1 further comprising a bias circuit coupled to each of the second gates of the plurality of MIGFETs.

5. The analog to digital converter of claim 4, wherein the bias circuit provides a bias voltage that alters the threshold voltage of each of the MIGFETs of the plurality of MIGFETs.

6. The analog to digital converter of claim 5, wherein the bias circuit is further characterized as being programmable.

7. The analog to digital converter of claim 1, wherein the MIGFETs are further characterized as being N channel.

8. An analog to digital converter comprising:
    a plurality of FETs that provides a plurality of digital output signals, wherein the plurality of FETS comprising a plurality of MIGFETs, and wherein
    each FET of the plurality of FETs has a first gate for receiving an analog signal and a current electrode for providing a digital output signal of a plurality of the digital output signals; and
    each FET of the plurality of FETs has a threshold voltage that is unique among the plurality of FETs.

9. The analog to digital converter of claim 8, wherein the plurality of MIGFETs have at least four different body widths.

10. The analog to digital converter of claim 9, wherein the plurality of MIGFETs have at least four different channel lengths.

11. The analog to digital converter of claim 10, further comprising a programmable bias circuit, wherein each MIGFET of the plurality of MIGFETs has a second gate coupled to the programmable bias circuit to alter the threshold voltage of each of the MIGFETs of the plurality of MIGFETs.

12. The analog to digital converter of claim 11, further comprising load devices coupled to the current electrodes of the MIGFETs, wherein the load devices comprise MIGFETs that have tunable impedances.

13. A digital to analog converter, comprising:
    a plurality of FETs that provides an analog signal at a summing node, wherein the plurality of FETS comprising a plurality of MIGFETs, and wherein each FET of the plurality of FETs has a first gate for receiving a different digital signal from among a plurality of digital signals, and a current electrode coupled to the summing node; and each FET of the plurality of FETs has a threshold voltage that is unique among the plurality of FETs.

14. The digital to analog converter of claim 13, wherein the plurality of MIGFETs have at least four different body widths.

15. The digital to analog converter of claim 14, wherein the plurality of MIGFETs have at least four different channel lengths.

16. The digital to analog converter of claim 15, wherein each MIGFET of the plurality of MIGFETs has a second gate for being biased to alter the threshold voltage of each of the MIGFETs of the plurality of MIGFETs.

17. The digital to analog converter of claim 16, further comprising a programmable bias circuit coupled to the second gates of the plurality of MIGFETs.

18. The digital to analog converter of claim 13, further comprising a current to voltage converter coupled to the summing node.

* * * * *